(12) United States Patent
Peremychtchev et al.

(10) Patent No.: US 6,381,873 B1
(45) Date of Patent: May 7, 2002

(54) METHOD FOR DRYING A POLYMER COATING ON A SUBSTRATE

(76) Inventors: Vladimir Peremychtchev, 1371-20$^{th}$ Ave., San Francisco, CA (US) 94122; Joseph Kristul, 270 Santa Clara Ave., San Francisco, CA (US) 94127; Igor Rakhvalsky, 1371-20$^{th}$ Ave., San Francisco, CA (US) 94122

( * ) Notice: Subject to any disclaimer, the term of this patent is extended or adjusted under 35 U.S.C. 154(b) by 0 days.

(21) Appl. No.: 09/633,095

(22) Filed: Aug. 4, 2000

(51) Int. Cl.$^7$ .................................................. F26B 3/00
(52) U.S. Cl. ........................... 34/497; 34/428; 34/429; 427/374.1
(58) Field of Search .................. 34/304, 419, 423, 34/428, 429, 497; 427/314, 316, 335, 374.1, 379, 398.1, 444

(56) References Cited

U.S. PATENT DOCUMENTS

| | | | | |
|---|---|---|---|---|
| 4,051,278 A | * | 9/1977 | Democh | 427/326 |
| 5,008,135 A | * | 4/1991 | Giordano et al. | 427/386 |
| 5,248,529 A | * | 9/1993 | Hammond et al. | 127/558 |
| 5,361,515 A | | 11/1994 | Peremychtcher | |
| 5,654,037 A | * | 8/1997 | Moore et al. | 427/379 |
| 6,329,117 B1 | * | 12/2001 | Padmanaban et al. | 430/270.1 |

OTHER PUBLICATIONS

V. P. Lavzischev et al. "Study of Mechanism . . .", 1975, Electronics, Issue 5(53) pp. 58–65 (Russian).
V.V. Anufrienko, et al. "Electronic Industry", No. 5(77) p. 50–52, 1979, Moscow.

* cited by examiner

*Primary Examiner*—Pamela Wilson

(57) ABSTRACT

An method for the formation of coating films on substrates which consists of a main high-temperature and high pressure drying chamber with two additional chambers located in front and behind the working chamber, respectively. The front drying chamber, which is installed between the loading station and the working chamber, is intended for drying the coating films at room temperature, while the rear drying chamber is intended for cooling after drying at high temperature and high pressure in the main working chamber. The front and rear chambers are provided with means for adjusting the respective drying and cooling processes by means of respective heating and cooling systems. This allows initial drying in a wider temperature range and final cooling under most optimum conditions.

13 Claims, 3 Drawing Sheets

METHOD FOR DRYING A POLYMER COATING ON A SUBSTRATE

FIELD OF THE INVENTION

The present invention relates to the field of semiconductor lithography, in particular to a method and apparatus for coating a substrate with a polymer solution and for drying the applied coating. More specifically, the invention relates to the formation of photo-, electron-, and X-ray resists on the surfaces of semiconductor wafers.

BACKGROUND OF THE INVENTION

Resists are organic or inorganic materials which are applied either directly onto the surface of semiconductor substrate or onto the surface of a topological layer preformed on the substrate for the formation of a selected latent image of a pattern which later is turned into a functional layer of a chip to be produced. In a majority of cases, the materials applied on the semiconductor substrate are organic materials. There exist a great variety of such materials. Among them, tens of polymer compositions are commercially used as polymer-type resists. Types and properties of some of them are described, by Wayne M. Moreau in: "Semiconductor Lithography. Principles, Practices, and Materials", Plenum Press, New York, London, 1988.

In the process of development of the latent image formed in the resist as a result of exposure to light or other radiant energy, the exposed or non-exposed areas are removed by subsequent etching processes to form the so called mask having a configuration of the aforementioned pattern. The aforementioned process is known as semiconductor lithography. The mask produced by the semiconductor lithography plays a crucially important role for protecting the masked areas during processing of opened areas in subsequent processes such as doping by ion implantation, coating in lift-off lithography, etching, etc. Films from which masks are formed are normally have a thickness within the range of from fractions of micron to several microns.

It is understood that protective property of the mask is one of the most important factors in the quality of the entire chip manufacturing process.

The properties of the mask, in turn, to a great extent depend on technological operations used in the manufacture of the masking film, such as application of a coating material on a substrate from a solution, uniform spreading of the applied material over the substrate, and drying of the applied coating for the formation of a coating film.

Quality of the masking films is determined by such factors as uniformity of thickness and properties, presence of defects such as pinholes, surface cracks, structural nonuniformity caused by foreign particles, etc., and adhesion.

It is understood that processes used for the manufacture of the mask should exclude formation of the aforementioned defects and combination with high adhesion of the film to the substrate.

It is obvious that a main process that determines the final quality of the mask is drying. In the context of the present invention, the term "drying" means removal of the solvent from the liquid polymer coating applied onto the surface of the substrate. It is understood that physical and chemical processes, which accompany removal of the solvent from resist also, may lead to conversions in the polymer itself. Such conversion, however, occur at temperatures higher than the temperature of drying. It should be noted in this connection, that the step of drying can be divided into a process of drying itself at a temperature that does not cause the aforementioned conversions and a process of baking at a temperature that is maintained to cause such conversion as hardening.

More specifically, drying out of a material includes the processes of penetration of the solvent from the polymer itself into free volumes in the polymer, such as voids, microcracks, or air bubbles with subsequent transition of the solvent from the liquid state into a vapor phase a gaseous phase (vapor). Kinetic characteristics (time behavior) of the above-indicated processes determine the mechanism of removal of the solvent from the coating.

The initial stage of drying, which is normally carried out at room temperatures, is characterized by a high content of the solvent in the polymer coating. As the coating becomes dry, the yield of the solvent into a gaseous phase is retarded, whereby the rate of drying is reduced. It is known, however, that by holding the polymer coating only at room temperatures, it is impossible to obtain high values of protective properties such as adhesion, defect-free condition, etc.

Therefore, for obtaining the above properties, drying should include a high-temperature stage (i.e., the stage at a temperature above room temperature but below the glass transition temperature for the polymer $-T_g$. After completion of the phase separation at the first stage of drying with the formation of a polymer matrix that contains the solvent, the increase in the process temperature accelerates diffusion of the solvent into the polymer (as a rule, a constant of diffusion depends on the temperature exponentially). As a result, the solvent is rapidly removed from the polymer matrix. Increase in the polymer temperature also decreases its viscosity, which in addition to the aforementioned accelerated diffusion, leads to a decrease in internal stress. This, in turn, affects uniformity of adhesion over the coating area. It is understood, however, that the high-temperature stage of drying should not exceed the level at which such undesirable thermodestruction or thermopolymerization may occur.

It is known that the initial stage of drying of a polymer at an increased temperature is accompanied by a sharp increase in the rate of solvent removal. After having reached its maximum, this rate then drops to zero.

As has been mentioned above, evaporation of the solvent from the external surface of the coating occurs in parallel with a phase transition (evaporation) into free volumes of the polymer matrix, such as microcracks, voids, etc. This process is known as internal vapor formation.

It has been proven experimentally that connection exists between internal vapor formation and protective properties, for example, of a photoresist coating. Many factors influence kinetic characteristics of the process of the internal formation. The following are examples of these factors: concentration of the solvent in the polymer, solvent vapor pressure, geometry of microcavities, density of distribution of microcracks and microcavities in the coating volume, coefficient of diffusion of the solvent, viscosity and surface tension of the polymer coating, and temperature of the coating.

The increase in the rate of internal vapor formation leads to an increase in concentration of defects and to a decrease in adhesion of the coating to the substrate. These phenomena are caused by an increase in the gas pressure of solvent vapor in microcracks and microcavities and by subsequent opening of the aforementioned microcracks and microcavities to the interface between the substrate and the coating film and to the external surface of the film.

It is obvious that surface microcracks as well as microcavities and microcracks located near the surface of the coating film affect adhesive and protective properties of the coating film to a lesser degree than those located inside the film and on the interface between the coating and the substrate. It is understood that aggregation of such defects distributed across the film cross section may lead to the formation of pinholes in the coating film.

At the first stage of drying the internal vapor generation in the protective coating with a high concentration of the solvent does not essentially affects protective properties of the polymer coating. This is explained by favorable conditions for removal of the solvent at this stage of the drying, such as a relatively high rate of diffusion of the solvent molecules in the polymer film and high mobility of the polymer molecules enhancing closing of microcracks and microcavities.

Decrease in the concentration of he solvent is accompanied by an increase in the viscosity of the polymer in the coating film and decrease in planarization ability (as used herein the planarization ability is an ability of the polymer to create a flat surface and to heal irregularities of edges of the opened microcracks).

It should be noted that microcracks and microcavities in the coating film greatly vary in their shape and dimensions and that the smaller these defects, the better properties of the final coating.

The factor preventing the action of internal vapor formation and suppressing the propagation of gas microcracks is an excessive external pressure in combination with heating of the coating film.

An attempt has been made to improve properties of the coating film by a method comprising the steps of: retaining the polymer coating at room temperature for a time interval from 20 sec to 1 hour; heating of the coating at an increased pressure sufficient for suppressing propagation of microcracks into the coating and for deteriorating its properties; and cooling the treated coating. See an article by V. P. Lavrischev, V. A. Peremychtchev in: "Study of mechanism of removing the solvent from the photoresist film", 1975 Electronics, issue 5 (53), pages 58–65).

However, the entire process was conducted in one and the same chamber, and this did not allow to eliminate the phenomenon of internal vapor formation. Therefore the method described above did not allow to produce a defect free product. Furthermore, this method does not ensure adequate adhesion of the coating film to the substrate, which shortens the service life of the polymer coating. Both drawbacks are initiated by the process of propagation of microcracks of the coating during its drying. This has been confirmed by experiments conducted with the use of an apparatus described in "Electronic industry" No. 5 (77), pages 50–52, 1979, Moscow, "Unit for forming photoresist coatings AFF-2", by V. V. Anufrienko, V. I. Osnin, V. A. Peremychtchev, V. L. Sanderov, V. N. Tsarev.

The aforementioned apparatus has a sealed working chamber with a heater connected to a loading chamber via an air-tight damper on one side and to an unloading chamber via an air-tight damper on the other side. The working chamber can be connected via an appropriate shut-off valve system to a high-pressure main.

In such a device the excessive pressure is built up at the stage of holding the polymer coating at elevated temperatures. In this case, building-up of the excessive pressure in a high-temperature chamber is possible only after loading the substrate into the chamber and closing the loading hatch with an air-tight damper. A disadvantage of the aforementioned device is that the high pressure is released while the substrate is still hot and development of microdefects is still possible.

Furthermore, even an insignificant time shift between the high-pressure process and the high-temperature process may result in an instant reaction of the film to deviations in the drying conditions with the formation of the cracks. This is because the film is very thin and can be instantly overheated under normal pressure if the application of high pressure and high temperature are not synchronized.

U.S. Pat. No. 5,361,515 issued to Peremychtchev on Nov. 8, 1994 discloses a method and apparatus for drying the protective polymer coating applied onto the surface of a substrate article from solution. The process described in the aforementioned U.S. patent is characterized by the fact that at the drying stage of holding the coating at room temperature, the action of excessive pressure precedes the raise of temperature, while at the stage of cooling the temperature drop precedes the release of high pressure.

The apparatus of U.S. Pat. No. 5,361,515 differs from the apparatus described above by a provision of two additional drying chambers located in front and behind the working chamber respectively. The front drying chamber, which is installed between the loading chamber and the working chamber, is intended for drying the coating at room temperature, while rear drying chamber is intended for cooling after drying at high temperature and high pressure in the main working chamber.

A main disadvantage of the invention of U.S. Pat. No. 5,361,515 is that the front and rear chambers have limited functional capabilities. More specifically, the front drying chamber, which determined initial stage of drying, makes it possible to conduct initial drying only in a strictly specified temperature range of 18° C. to 28° C. However, films formed prior to transfer to the main high-temperature and high-pressure chamber under the indicated temperature range, may have meso- and macroscopic nonuniformities. This is because isolation of the phase with low content of the solvent may occur already in the initial drying stage in the front chamber. This means that the in the coating film transferred to the main chamber the solvent may already have a nonuniform distribution. In other words, the coating film will contain inclusion of a solid phase, i.e., inclusions of the phase, which is harder than the rest of the coating material. Such clusterization takes place during polymerization even in a liquid phase.

In subsequent drying under high temperature and high pressure the aforementioned solid phase inclusions will serve as sources of concentration of stress, impair adhesion, and form microcracks and microcavities around the nuclei of the stress.

It is known that the film formation process has a very complicated mechanism, which depends not only on the temperature of drying but also on variation of temperature in time. Therefore it is very important to control the initial drying process in time. However, the apparatus of U.S. Pat. No. 5,361,515 does not allow such control.

The stage of cooling in the rear chamber after release of pressure is carried out via a contact-type cooler which does not allow quick and combined modes of cooling which may be required for obtaining a high quality coatings free of internal stress and microdefects in combination with high adhesive properties of the coating film.

OBJECTS OF INVENTION

It is an object of the invention to provide a method and apparatus, which allow initial drying in a wide temperature range with controlled temperature variation mode in the drying stage. Another object is to provide method and apparatus which allow quick and combined modes of cooling of the coating film at the cooling stage after release of high temperature and high pressure. Still another object is to provide coating films, which are free of defects caused by internal stress and microcavities.

SUMMARY OF THE INVENTION

An apparatus of the invention is intended for the formation of coating films on substrates and consists of a main high-temperature and high pressure drying chamber with two additional chambers located in front and behind the working chamber respectively. The front drying chamber, which is installed between the loading station and the working chamber, is intended for drying the coating at room temperature, while the rear drying chamber is intended for cooling after drying at high temperature and high pressure in the main working chamber. The front and rear chambers are provided with means for adjusting the respective drying and cooling processes by means of respective heating and cooling systems. This allows initial drying in a wider temperature range and final cooling under most optimum conditions.

DETAILED DESCRIPTION OF THE INVENTION

Figure 1:
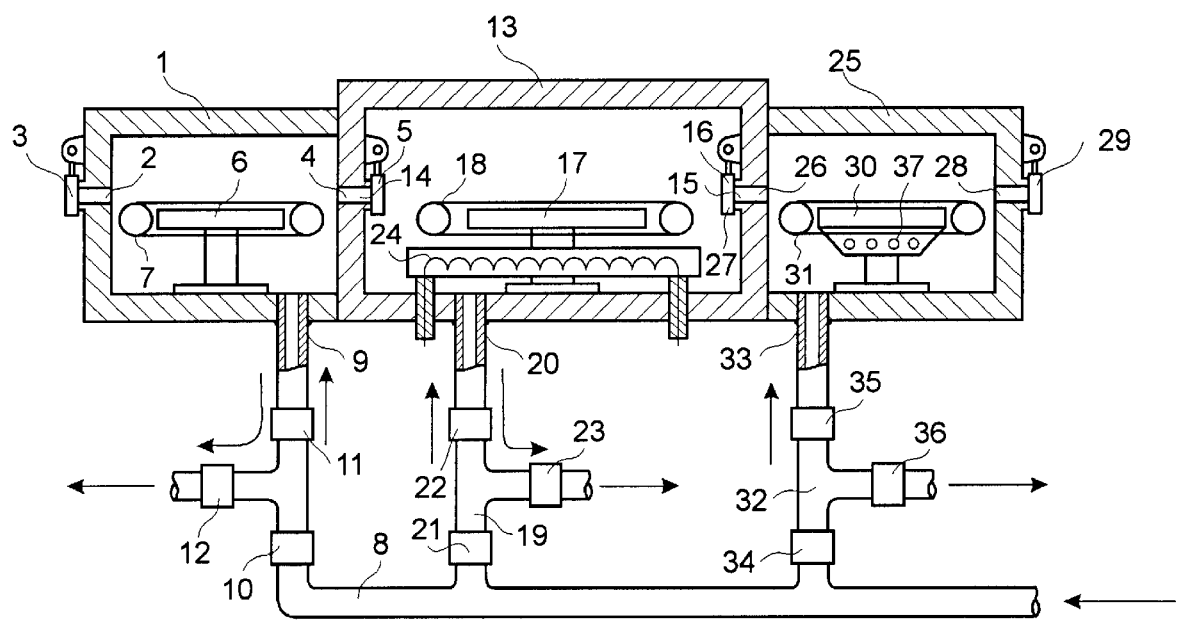
FIG. 1 is a side sectional view of a known apparatus for the formation of coating films on substrates with the drying under elevated pressure.
Figure 2:
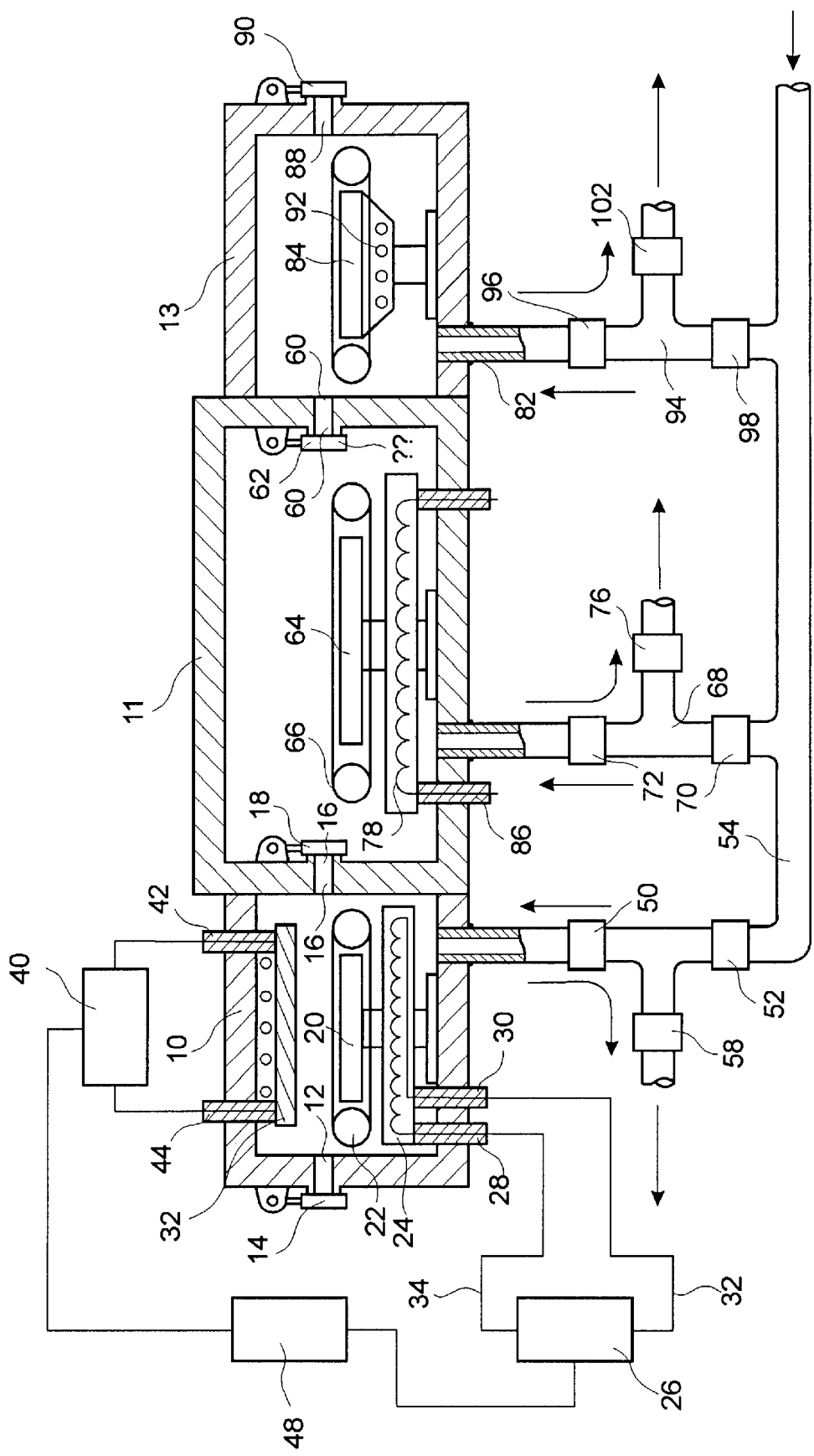
FIG. 2 is a side sectional view of an apparatus of the invention for the formation of coating films on substrates with an improved chambers for preliminary drying and a for post-drying cooling.

An apparatus of the invention for drying a polymer coating on a substrate is shown in FIGS. 2, which is a side sectional view of the apparatus. As can be seen from this drawing, similar to the prior art device, the apparatus of the invention consists of three major parts sequentially arranged one after another in the direction of process steps, i.e., a preliminary drying chamber 10, a main high-pressure drying chamber 11, and a post-drying cooling chamber 13.

The preliminary drying chamber 10 is a sealed chamber, which has a loading hatch 12 with an air-tight damper 14 and an unloading hatch 16 with an air-tight damper 18. Located inside the chamber 10 is a platform 20 for receiving semiconductor substrates (not shown) with a polymer coating, e.g., a semiconductor wafer with a resist coating in a liquid state, and a conveying mechanism 22 in the form of an endless belt for conveying the wafers from the loading hatch 12 to the unloading hatch 16.

Located underneath the platform 20 is a preheater 24, e.g., of an infrared type. This infrared preheater may comprise, e.g., quartz lamps having tungsten spiral heating elements and filled with krypton. The preheater is connected to an electric power supply unit 26 via electric feedthrough devices 28 and 30 and lead wires 32 and 34. Such feedthrough devices are known in the art.

Located above the platform 20 is a precooler 36 in the form of a flat heat exchanger with dimensions exceeding the size of the water being treated. The precooler may comprise, e.g., a Peltier-type cooler which consists of a semiconductor plate 38 connected to a current supply unit 40 via electric feed through devices 42 and 44. The heat generated by the semiconductor plate is removed by heat-exchanging tubes 46, which are guided outside the chamber 10 via feedthrough devices (not shown). Peltier-type coolers are produced, e.g., by ThermoElectric Cooling America, Chicago Ill., USA.

The coolers of this type are characterized by instant cooling which is very important for controlling the preliminary drying process.

The current supply units 26 and 40 are connected to a controller 48 for simultaneous controlling operations of the preheater 24 and the precooler 36.

The chamber 10 is connected via shut-off valves 50 and 52 with a high-pressure pipeline 54. A branch 56 from the portion of the pipeline 54 located between the shut-off valves 50 and 52 has a shut-off valve 58 for connection to the atmosphere.

The preliminary drying chamber 10 is connected via the unloading hatch 16 to the main high-temperature high-pressure drying chamber 11.

The high-temperature chamber 11 is a sealed chamber which is provided with a hatch 60 and an air-tight damper 62 for unloading the wafers into the post-drying cooling chamber 13. Located inside the high-temperature chamber 11 is a platform 64 for receiving the wafers from the chamber 11 and a mechanism 66 in the form of an endless belt for conveying the wafers. The chamber 11 is connected with a high-pressure pipeline 54 through a pipe 68 with two shut-off valves 70 and 72. The pipe 68 has a branch 74 between the shut-off valves 70 and 72. The branch 74 has a shut-off valve 76 for connecting the pipe 68 to the atmosphere.

Located beneath the platform 64 is a heater 78, which is connected via electric feedthrough devices 80 and 82 to a current supply unit (not shown).

Next in the direction of movement of the substrate in the technological process is the post-drying cooling chamber 13. Similar to the chambers 10 and 11, the chamber 13 is a sealed chamber that has a platform 84 with a wafer conveying means 86 in the form of an endless belt. The wafers are loaded onto the platform 84 via the hatch 60 and an air-tight damper 62 of the high-temperature high-pressure chamber 11. The treated wafers are unloaded from the chamber 13 via a hatch 88 and an air-tight damper 90.

Located beneath the platform 84 is a cooler 92, e.g., of the same type as the Peltier cooler 36 of the chamber 10. The feedthrough devices, power supply, and a controller of the cooler 36 are not shown as they are substantially the same as those associated with the cooler 36. Similar to the chambers 10, and 11, the cooling chamber 13 is connected to the high-pressure pipeline 54 via a pipe 94 having two shut-off valves 96 and 98. The pipe 94 has a branch 100 at a point between the shut-off valves 96 and 98 with a shut-off valve 102 for connecting the pipe 94 to the atmosphere.

Operation of the Apparatus of FIG. 2

The apparatus of the invention operates as follows:

Preliminarily, the high-temperature chamber 11 is prepared for operation. For this purpose, the air-tight dampers 18 and 62 are closed, the heater 78 is activated, the shut-off valves 70 and 72 of the high-pressure pipeline 54 are opened (the shut-off valve 76, which connects the chamber 11 with the atmosphere, is closed for the entire cycle of drying of the polymer protective coating).

A substrate (not shown) with a liquid polymer coating on its upper surface is loaded into the preliminary drying chamber through the opened loading hatch 12 by means of the conveying belt 22 onto the platform 20. The damper 14 of the hatch 12 is closed, and the shut-off valve 50 is opened while the shut-off valve 52 is opened (the shut-off valve 58 that connects the chamber 10 with the atmosphere, is closed). Under these condition, the preliminary drying cycle, i.e., the first temperature cycle, is initiated. The heater 24 and the cooler 36 are activated, and the controller 48 sets the temperature mode for the first temperature cycle.

Figure 3:
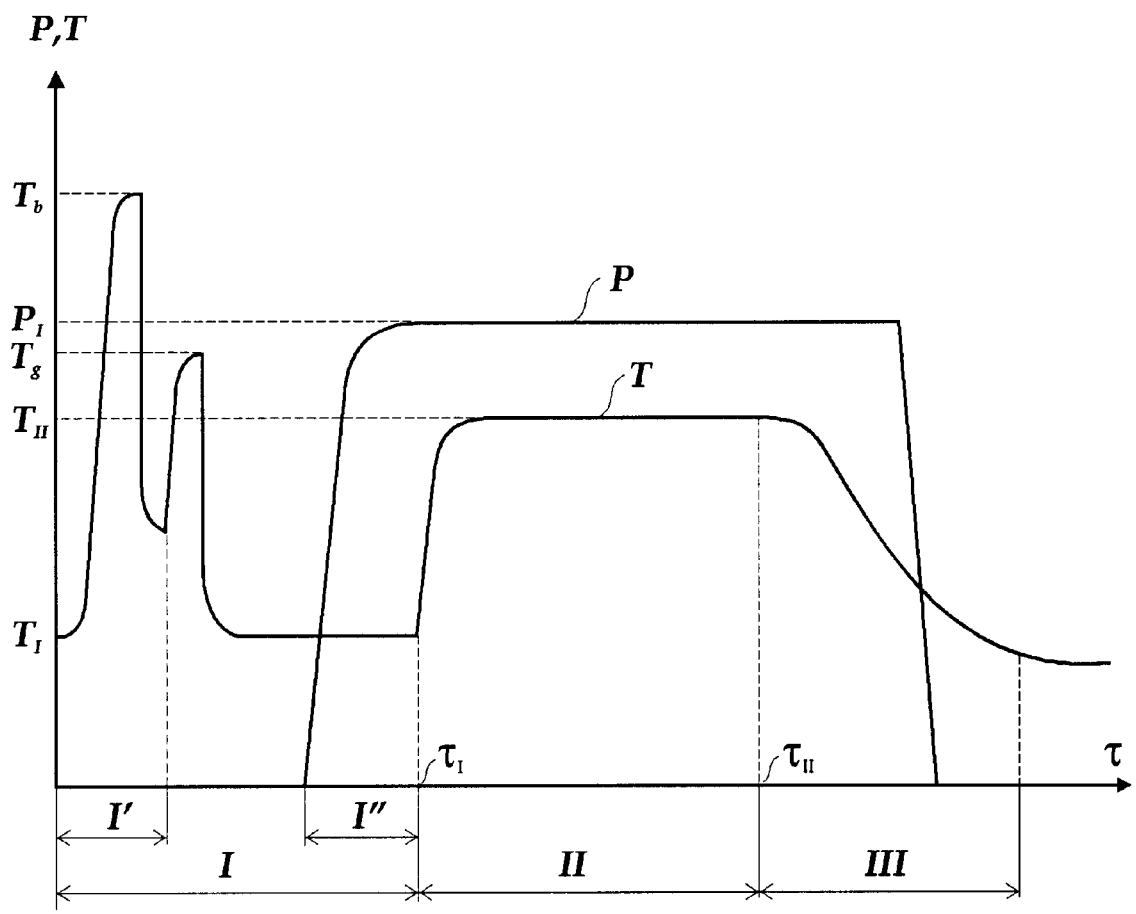
FIG. 3 is a graph illustrating an example of temperature variations during preliminary drying of the coating layer.

The inventor has found that polymeric coatings may require different temperature modes of preliminary drying, which depend, e.g., on the type of the polymer and the type of a solvent in the coating. Therefore the temperatures required for the first temperature cycle may go beyond the range of 18° C. to 28° C., as specified by the U.S. Pat. No. 5,361,515. In other words, the temperature of first temperature cycle may be below 18° C. and higher than 28° C. Furthermore, some types of resists, e.g., Kodak KTFR negative photoresist (trademark of Eastman Kodak), or the like, in combination with a number of solvents, demonstrate the best results when the first temperature cycle is carried out at a temperature exceeding 30° C. Other resists may require complicated temperature modes with rapidly alternating cycles of heating and cooling to room temperature. An example of such alternating temperature modes is shown in FIG. 3, where time is plotted on the abscissa axis and the temperature is plotted on the ordinate axis. More specifically, the mode of the first temperature cycle in the chamber 10 may include several cycles of rapid heating to a temperature close to or even slightly exceeding (by several degrees) the glass transition point $T_g$ and even the boiling point $T_b$ of the solvent, in which the polymer is dissolved. Under this condition, the solvent is not transferred into a gaseous phase, but rather is turned into an overheated liquid, which has a very high mobility in the polymer matrix. As a result, the solvent is expelled from the inner layers of the coating film to the surface of the film without violation of the continuity of the coating film.

As shown in FIG. 3, the first temperature cycle in the chamber is started at atmospheric pressure and then, after a certain period of time, the shut-off valve 58 is closed, the shut-off valves 50 and 52 are opened, and hatch 18 is opened. As a result, the working gas is supplied under an elevated pressure to the chamber 10, so that the pressure in this chamber rapidly increases (FIG. 3). This constitutes a first pressure cycle, i.e., the pressure cycle conducted in the preliminary drying chamber.

The final temperature of the wafer at this stage of drying is determined by the temperature mode which is set by the controller and is selected in a wide range, depending on the type of the polymer and solvent in the coating layer. An example of the temperature mode in the chamber 10 is shown in FIG. 3 as alternating heating and cooling cycles. It is understood that such a mode is given only as an example and that many other temperature modes are possible.

After the first temperature cycle, which is conducted in the chamber 10, is accomplished, the wafer is transferred via the open hatch 16 onto the platform 64 of the chamber 11 by the conveyor belt 66. Since the hatch 16 was open, the pressure in the chamber 11 is the same as in the chamber 10.

The main drying cycle, i.e., the second temperature cycle, which is conducted in the high-temperature high-pressure chamber 11, does not differ from that of the prior art device. More specifically, the wafer is retained in the chamber 11 at a predetermined temperature, which in general is higher than the temperature in the chamber 10 (FIG. 3), and under the same predetermined pressure selected so as to provide the most optimal conditions for the main drying cycle and for the formation of a high-quality coating layer free of defects.

After the wafer is transferred to the platform 64 of the high-temperature high-pressure chamber, the damper 18 may be closed for closing communication between the chambers 10 and 11. However, since the shut-off valves 70 and 72 are open, and the shut-off valve 76 is closed, the chamber 11 remains connected to the high-pressure pipeline 54, so that pressure in the chamber 11 remains high. As soon as the hatch 16 is closed, the shut-off valve 52 is closed, and the shut-off valve 58 is opened, whereby the pressured in the chamber 10 is released to the atmosphere. The hatch 12 can now be opened by opening the damper 14, so that the next wafer can be loaded into the preliminary drying chamber 10, and processing of the next wafer can be started while the first wafer is still in the high-temperature high-pressure cycle in the chamber 11. The pressure cycle conducted in the chamber 11 is called the second pressure cycle.

When this high-temperature high-pressure cycle is close to completion, the shut-off valve 102 is closed and the shut-off valves 96 and 98 are opened. The damper 90 of the hatch 88 in the post-drying cooling chamber 13 is also closed. Upon completion of the second temperature cycle and the second pressure cycle in the chamber 11, the pressure in the chambers 11 and 13 is the same, since both these chambers are connected to the high-pressure pipeline 54 via respective shut-off valves. Now the damper 62 of the hatch 60 can be opened, and the first wafer is transferred by the conveyor belt 66 to the conveyor belt 86 via the hatch 60 and is placed onto the platform 84 of the post-drying cooling chamber 13.

Since the temperature of the platform 84 and of the entire environment in the chamber 13 is preset by the controller (not shown) and is lower than in the high-pressure high-temperature chamber 11, the process of cooling of the first wafer is started at the moment when this wafer enters the chamber 13. The cooling is carried out by means of the heat-exchange cooler 92. During this cooling cycle the high-temperature high-pressure cycle can be started for the second wafer, and the first chamber 10 can be prepared for loading the third wafer. The third wafer is then loaded into the first chamber 10 after the hatch 60 is closed. When the cooling cycle in the chamber 13 is close to completion, the hatch 60 is closed by the damper 62, and the pressure in the chamber 13 is dropped by closing the shut-off valve 98 and opening the shut-off valve 102. The hatch 88 is then opened by raising the damper 90, and the first wafer is unloaded from the apparatus as a final product.

The entire wafer treatment cycle is then repeated for the second wafer, which by that time could have been transferred to the platform 64 of the chamber 11.

EXAMPLES

The method and the apparatus of the invention were tested experimentally by drying coating films prepared from photoresists of DQ-type produced by Elma Factory, Zelenograd, Russia and of FP-051SH type produced by NIOPIK, Dolgtoprudny, Russia.

The tests were aimed at studying dependence of adhesion on parameters of drying of the photolayer under pressure, in particular, on the temperature of the polymer coating in the low-temperature stage of the process prior to the high-temperature high-pressure cycle.

Types of photoresists chosen for the tests had different compositions including different solvents and different viscosities.

The polymers were applied onto a chromium-plated glass substrates by a centrifuge with the frequency of rotation that ensured thickness of the coating layer in the range of 1.0±0.05 μm. Subsequent drying was carried out on the apparatus of the invention. The test was carried out under the following temperature conditions:

22° C.—temperature of the environment (the heat exchanger is switched off);

14° C.—manufacturer-recommended storage temperature for DQ-photoresists;

30° C.—temperature at which rapid removal of the solvent from the photoresist is initiated.

Other temperature and pressure conditions were the same as in the method described in U.S. Pat. No. 5,361,515. The residence time of preliminary drying in the first chamber was 3 min. The residence time for high-temperature high-pressure drying in the second chamber at 100° C. was 15 min. The pressure was 0.8 MPa. Ten plates of photoresists of each type were tested.

A criterion of adhesive strength of the coating layer to the substrate was a condition of a 1 $\mu$m-wide control line produced in photoresist by photolithography. The adhesive strength was evaluated by immersing the test plates in a weak solution (06.%) of KOH and measuring the lifetime of the aforementioned line on the substrates.

The results of the test are given in a table below.

| Photoresist (0.5 $\mu$m thickness) | Temperature during preliminary drying, ° C. | Number of plates (out of 10) that preserved the marking line Treatment time (min) | | | | | |
| --- | --- | --- | --- | --- | --- | --- | --- |
| | | 20 | 40 | 60 | 80 | 100 | 120 |
| FP-617 | 14 | 10 | 10 | 9 | 4 | 2 | 0 |
| | 22 | 10 | 10 | 10 | 8 | 5 | 3 |
| | 30 | 10 | 10 | 10 | 10 | 9 | 9 |
| FP-051SH | 14 | 10 | 9 | 9 | 9 | 9 | 8 |
| | 22 | 10 | 7 | 5 | 1 | 0 | — |
| | 30 | 8 | 5 | 4 | 0 | — | — |

As can be seen from this table, the temperature during preliminary drying affects the adhesive strength. This dependence is different for different resists. It can also be seen that improved adhesion can be obtained by preliminary drying at temperatures beyond the limits specified by U.S. Pat. No. 5,361,515.

Thus, it has been shown that the present invention provides a method and apparatus, which allow initial drying in a wide temperature range with controlled temperature variation mode in the drying stage, and combined modes of cooling of the coating film at the cooling stage after release of high temperature and high pressure. The invention provides quick removal of the solvent at the initial drying stage without violating the continuity of the coating film and without defects caused by internal stress and microcavities.

Although the invention has been described with reference to a specific embodiment, it is understood that this embodiment should not be construed as limiting the application of the invention. Therefore any changes in the shapes, materials, and constructions are possible, provided these changes do not depart from the scope of the patent claims. For example, the temperature mode in the chamber 10 can be different from the one shown in FIG. 3. The temperature in the chamber 10 can be raised to the level of temperature in the chamber 11 prior to initiation of the preliminary drying cycle in the chamber 10. The shut-off valves 50, 62, 58, 70, 72, 76, 96, 98, 102 can be controlled automatically and in synchronism with opening and closing the hatches by means of respective dampers. The three chamber apparatus was shown as an example of the most productive process suitable for continuous treatment of large quantities of substrates. It is understood that the entire method can be carried out in a single chamber, e.g., in the first chamber. In this case, however, each next drying step can be initiated only after completion of the previous step.

What is claimed is:

1. A method for a defect-free drying of a polymer coating applied onto a substrate from a solution that contains a polymer dissolved in a solvent, comprising the steps of:

placing a first substrate with said polymer coating into a first sealed chamber;

retaining said first substrate with said polymer coating in said first sealed chamber for a first period of time in a first temperature cycle that ensures rapid removal of a portion of said solvent from said polymer coating without violating continuity of said polymer coating;

transferring said first substrate with said polymer coating from said first sealed chamber to a second sealed chamber;

retaining said first substrate with said polymer coating in said second sealed chamber in a second temperature cycle at a temperature and under a pressure that ensure removal of said solvent remained after the first temperature cycle from said polymer coating;

transferring said first substrate with said polymer coating from said second sealed chamber to a third sealed chamber; and cooling said first substrate with said polymer coating in said third chamber for accomplishing said defect-free drying.

2. The method of claim 1, wherein at least part of said first temperature cycle has a temperature at which said solvent is maintained liquid.

3. The method of claim 2, wherein said temperature in at least said part of said first temperature cycle is higher than the boiling point of said solvent at normal pressure.

4. The method of claim 3, wherein said at least part of said first temperature cycle has at least one peak with a time duration less than a time required for boiling up said solvent.

5. The method of claim 1, wherein at least part of said first temperature cycle has a temperature higher than the glass transition point of said polymer but lower than the boiling point of said solvent.

6. The method of claim 1, wherein said pressure in said first temperature cycle is developed at a moment of time prior to initiation of said first temperature cycle.

7. The method of claim 1, wherein a second substrate with said polymer coating is loaded into said first sealed chamber while said first substrate with said polymer coating is still treated in said second sealed chamber.

8. The method of claim 7, wherein a third substrate with said polymer coating is loaded into said first sealed chamber while said second substrate with said polymer coating is still treated in said second sealed chamber, and said first substrate with said polymer coating is still treated in said third sealed chamber.

9. The method of claim 1, wherein at least part of said first temperature cycle has a temperature at which said solvent is maintained liquid.

10. The method of claim 1, wherein said temperature in at least said part of said first temperature cycle is higher than the boiling point of said solvent at normal pressure.

11. The method of claim 10, wherein said at least part of said first temperature cycle has at least one peak with a time duration less than a time required for boiling up said solvent.

12. The method of claim 1, wherein at least part of said first temperature cycle has a temperature higher than the glass transition point of said polymer but lower than the boiling point of said solvent.

13. The method of claim 1, wherein said pressure in said first temperature cycle is developed at a moment of time prior to initiation of said first temperature cycle.

* * * * *